United States Patent
Shim et al.

(10) Patent No.: US 9,435,022 B2
(45) Date of Patent: Sep. 6, 2016

(54) DEPOSITION SOURCE

(71) Applicant: SAMSUNG DISPLAY CO., LTD., Yongin, Gyeonggi-do (KR)

(72) Inventors: Hye-Yeon Shim, Yongin (KR); Chang-Soon Ji, Yongin (KR); Jong-Woo Lee, Yongin (KR); Do-Sung Kwon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 321 days.

(21) Appl. No.: 13/923,186

(22) Filed: Jun. 20, 2013

(65) Prior Publication Data

US 2013/0280441 A1    Oct. 24, 2013

Related U.S. Application Data

(63) Continuation of application No. 12/857,665, filed on Aug. 17, 2010, now abandoned.

(30) Foreign Application Priority Data

Sep. 25, 2009  (KR) .................. 10-2009-0091144

(51) Int. Cl.
| | |
|---|---|
| C23C 14/24 | (2006.01) |
| C23C 14/30 | (2006.01) |
| C23C 14/26 | (2006.01) |
| H01L 51/00 | (2006.01) |
| H01L 51/56 | (2006.01) |

(52) U.S. Cl.
CPC ............ *C23C 14/30* (2013.01); *C23C 14/24* (2013.01); *C23C 14/243* (2013.01); *C23C 14/26* (2013.01); *H01L 51/001* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 5,104,695 | A | 4/1992 | Greer et al. |
| 5,655,666 | A | 8/1997 | Salzmann |
| 2003/0051662 | A1 | 3/2003 | Lee et al. |
| 2003/0232138 | A1 | 12/2003 | Tuominen et al. |

FOREIGN PATENT DOCUMENTS

| | | |
|---|---|---|
| EP | 1 418 250 A2 | 5/2004 |
| JP | 61-030661 | 2/1986 |
| JP | 03-107452 | 5/1991 |
| KR | 10-2004-0034537 | 4/2004 |

OTHER PUBLICATIONS

KIPO Notice of Allowance dated Mar. 22, 2011, for Korean priority Patent application 10-2009-0091144, 5 pages.

*Primary Examiner* — Joseph Miller, Jr.
(74) *Attorney, Agent, or Firm* — Lewis Roca Rothgerber Christie LLP (57) ABSTRACT

A deposition source with uniform deposition characteristics includes a crucible in which a deposition material is disposed; a heat transfer member disposed on upper portions of the deposition material in the crucible; and an accommodation member for accommodating the heat transfer member and including a mesh plate.

6 Claims, 8 Drawing Sheets

DEPOSITION SOURCE

CROSS-REFERENCE TO RELATED APPLICATION

This application is a continuation of U.S. patent application Ser. No. 12/857,665, filed Aug. 17, 2010, which claims priority to and the benefit of Korean Patent Application No. 10-2009-0091144, filed Sep. 25, 2009, the entire content of both of which is incorporated herein by reference.

BACKGROUND

1. Field

Aspects of the present invention relate to a deposition source, and more particularly, to a deposition source with uniform deposition characteristics.

2. Description of the Related Art

Electronic devices include a fine thin film and use various methods to form the fine thin film. Particularly, flat display devices are manufactured by forming a plurality of thin films. Thus, in order to improve the characteristics of flat display devices, the characteristics of the plurality of thin films need to be improved.

Organic light-emitting display apparatuses, among flat display devices, have a larger viewing angle, better contrast characteristics, and a faster response rate than other flat display devices, and thus have drawn attention as a next-generation display device. An organic light-emitting layer that emits visible rays from an organic light-emitting display apparatus, and organic layers disposed around the organic light-emitting layer are formed using various methods. Particularly, vacuum deposition, which is a simple process, is frequently used to form the organic layers. In vacuum deposition, a deposition material in a powder form is put in a crucible used in a deposition process, and is heated to form a deposited film in a desired portion.

A dotted deposition source, a linear deposition source or a plate-shaped deposition source is used in the vacuum deposition. Specifically, in vacuum deposition, a deposition material in a powder form is put in a crucible. The crucible is heated so that gas particles may be moved towards a substrate and the deposition material is deposited on the substrate to form a deposited film.

In this process, heat is non-uniformly transferred to the deposition material. As such, the deposition material may be non-uniformly vaporized. Also, a splash phenomenon can occur, where the deposition material forms into a mass and splashes out of the deposition source while it is being vaporized. As such, deposition characteristics of the deposition source are lowered, and there is a limitation in forming a desired deposited film.

SUMMARY

Aspects of the present invention provide a deposition source with improved deposition characteristics.

According to an aspect of the present invention, there is provided a deposition source including: a crucible in which a deposition material is disposed; a heat transfer member disposed on an upper portion of the deposition material filled in the crucible; and an accommodation member for accommodating the heat transfer member and including a mesh plate.

According to an aspect of the invention, the heat transfer member may be a thermo ball.

According to an aspect of the invention, the accommodation member may include a bottom portion disposed facing the deposition material and a side portion that is connected to the bottom portion and forms a side surface of the accommodation member, where the bottom portion and the side portion are formed in a shape of the mesh plate.

According to an aspect of the invention, the accommodation member may further include a top portion that is parallel to the bottom portion and is connected to the side portion, where the top portion is formed in a shape of the mesh plate.

According to an aspect of the invention, the top portion may be connected to the side portion by welding.

According to an aspect of the invention, the accommodation member may include a cover portion disposed on upper portions of the deposition material, and the cover portion may be formed in the shape of the mesh plate.

According an aspect of the invention, supports may be disposed on the side portion, and the supports may be connected to the bottom portion.

According to an aspect of the invention, the supports may include titanium (Ti).

According to an aspect of the invention, the accommodation member may be formed to correspond to an inner circumferential surface of the crucible.

According to an aspect of the invention, the mesh plate may be formed so that the heat transfer member does not escape from the accommodation member.

Additional aspects and/or advantages of the invention will be set forth in part in the description which follows and, in part, will be obvious from the description, or may be learned by practice of the invention.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Reference will now be made in detail to the present embodiments of the present invention, examples of which are illustrated in the accompanying drawings, wherein like reference numerals refer to the like elements throughout.

The embodiments are described below in order to explain the present invention by referring to the figures.

Figure 1:
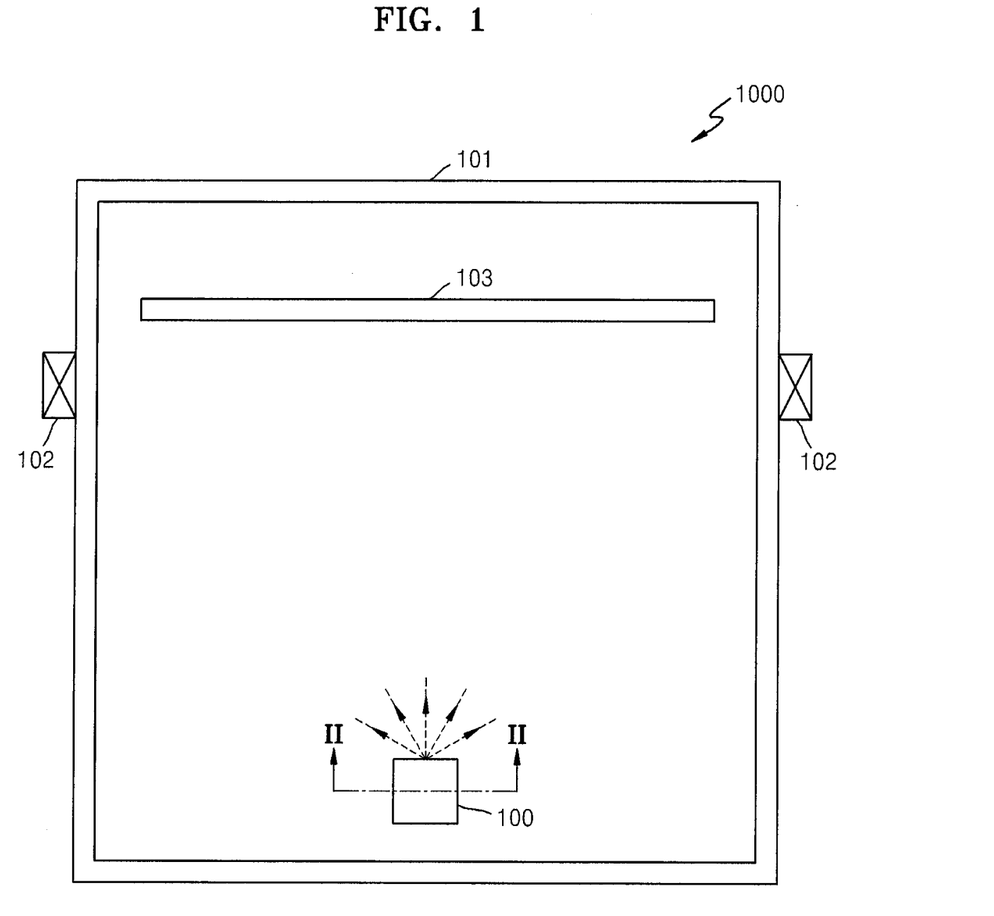
FIG. 1 is a schematic front view of a deposition device including a deposition source according to an embodiment of the present invention.
Figure 2:
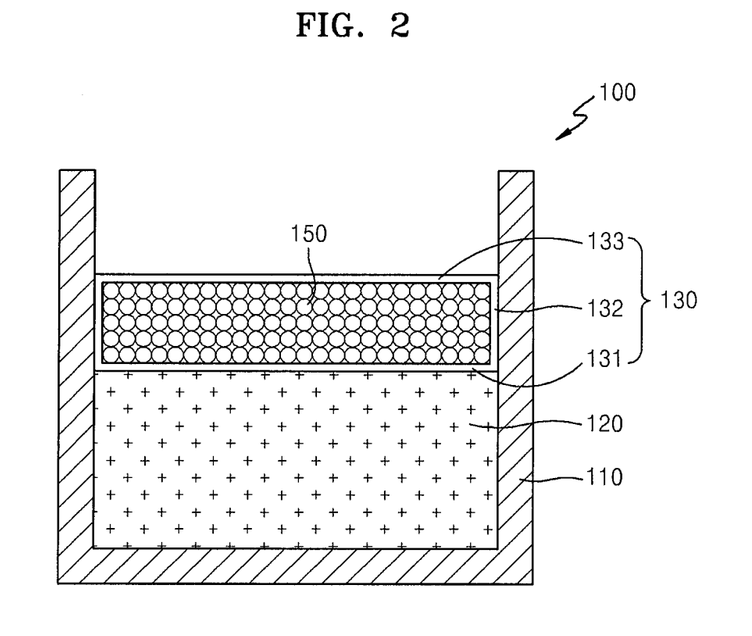
FIG. 2 is a cross-sectional view taken along line II-II of FIG. 1.
Figure 3:
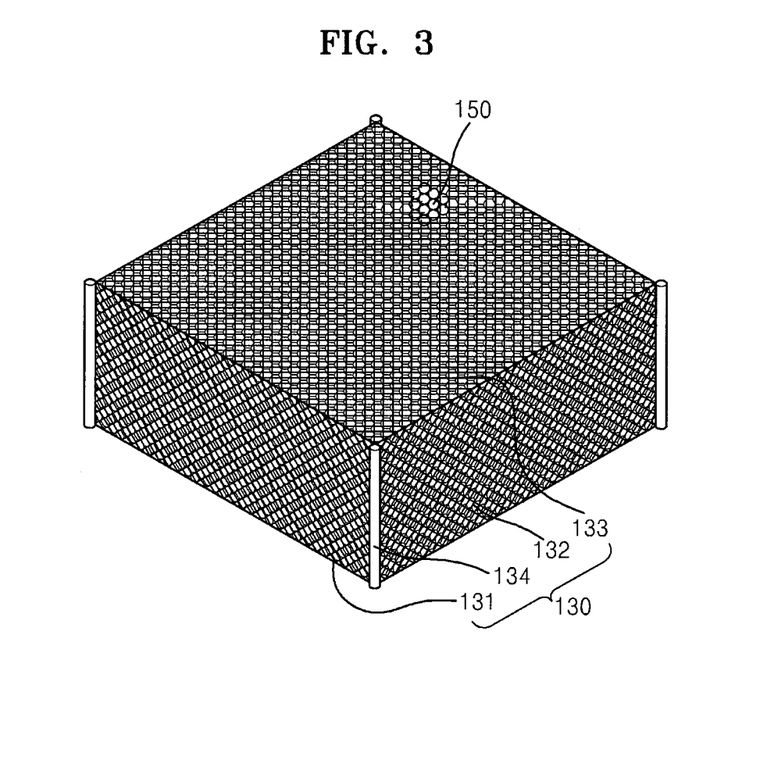
FIG. 3 is a schematic perspective view of an accommodation member of FIG. 2.

FIG. 1 is a schematic front view of a deposition device 1000 including a deposition source 100 according to an embodiment of the present invention, FIG. 2 is a cross-sectional view taken along line II-II of FIG. 1, and FIG. 3 is a schematic perspective view of an accommodation member 130 of FIG. 2.

Referring to FIG. 1, the deposition device 1000 includes a chamber 101 and a deposition source 100 disposed in the chamber 101. A substrate 103 is disposed in the chamber 101 facing the deposition source 100. The substrate 103 is a region on which a deposition material is to be deposited. A deposition process may be performed after the substrate 103 is fixed in the deposition device 1000 with a clamp or a support (not shown), but aspects of the invention are not limited to specific fixing devices.

At least one pump (not shown) is connected to the chamber 101 to keep the chamber 101 in a vacuum state or under low pressure. Also, an outlet 102 is disposed at a side surface of the chamber 101. The substrate 103 is transferred between the inside and outside of the chamber 101 through the outlet 102. While shown as a single outlet 102, it is understood that multiple outlets can be used to provide multiple pathways between the inside and outside of the chamber 101.

As shown in the embodiment in FIG. 2, the deposition source 100 includes a crucible 110, an accommodation member 130, and a heat transfer member 150. The crucible 110 is filled with a deposition material 120. The shown deposition source 100 is of a point type and includes a rectangular crucible 110. However, the present invention is not limited thereto, and the deposition source 100 may include a crucible 110 having, for example, a circular cross-section. The crucible 110 may be formed of material such as metal or conductive ceramics, but the invention is not limited thereto.

The deposition material 120 is heated by a heating unit (not shown), and is changed to a gaseous state. The deposition material 120 in the gaseous state leaves the crucible 110, and moves to the substrate 103 on which the deposition material is deposited to form a layer of the deposition material. The heating unit may heat the crucible 110 by using electron beam heating or resistive heating, but the invention is not limited thereto.

The accommodation member 130 accommodates the heat transfer member 150. The accommodation member 130 is disposed in the crucible 110 to cover the deposition material 120 such that the deposition material 120 in the gaseous state moves through the heat transfer member 150. The heat transfer member 150 allows heat to be uniformly transferred to the deposition material 120 when the crucible 110 is heated, so that uniformity of deposition is improved. The heat transfer member 150 may be a thermo ball, but the invention is not limited thereto.

The heat transfer member 150 includes material that does not affect the deposition material 120 and has good heat transfer efficiency and high heat-resistance properties so that the heat transfer member 150 is not damaged even at a high temperature. In detail, the heat transfer member 150 may include a silicon (Si) powder having an appropriate diameter, but the invention is not limited thereto.

When the deposition material 120 is an organic material, a splash phenomenon can occur where the deposition material 120 is locally heated and the organic material forms into a mass and splashes out of the deposition source 100. The heat transfer member 150 is disposed on the deposition material 120, and vaporized gas particles of the deposition material 120 pass through the heat transfer member 150 and are discharged to the substrate 103. In other words, the gas particles when in a mass form do not pass through the heat transfer member 150. Thus, the splash phenomenon may be efficiently prevented.

The heat transfer member 150 is disposed in the accommodation member 130. The accommodation member 130 includes a bottom portion 131, a side portion 132, and a top portion 133. The bottom portion 131, the side portion 132, and the top portion 133 are formed in the shape of a mesh plate. In detail, the bottom portion 131, the side portion 132, and the top portion 133 have a mesh that is smaller than the size of particles of the heat transfer member 150 so that the heat transfer member 150 may not escape from the accommodation member 130. While shown as square, it is understood that the accommodation member 130 can be other shapes depending on the shape of the deposition material 120 and the crucible 110. Further, the side portion 132 can have a single continuous side as opposed to separate sides as shown, such as where the crucible 110 has a round cross section, and the side portion 132 need not be of a mesh and can be a solid surface without openings. Lastly, while described as a mesh plate, it is understood that the surfaces can be of any material having openings, and the openings need not be of uniform size.

The bottom portion 131, the side portion 132, and the top portion 133 of the accommodation member 130 are formed of metal having heat-resistance properties. However, the present invention is not limited thereto. The bottom portion 131, the side potion 132, and the top portion 133 of the accommodation member 130 may be formed of various materials having high durability so as to efficiently accommodate the heat transfer member 150.

The accommodation member 130 further includes supports 134. The supports 134 are disposed on corner edges of the side portion 132. The supports 134 connect the bottom portion 131 and the top portion 133 so that durability of the accommodation member 130 is improved. The supports 134 may include titanium (Ti) having high durability, but the invention is not limited thereto.

The accommodation member 130 accommodates the heat transfer member 150 so that the heat transfer member 150 is uniformly distributed above the deposition material 120. The heat transfer member 150 is in the form of particles and needs to be uniformly distributed over the deposition material 120 so that heat is uniformly transferred to the deposition material 120 and the splash phenomenon of the deposition material 120 is efficiently prevented.

The particles of the heat transfer member 150 can become concentrated in one direction from an upper portion of the deposition material 120 due to shaking of the crucible 110 or a change of distribution of pressure in the crucible 110. However, with the heat transfer member 150 disposed in the accommodation member 130, the particles of the heat transfer member 150 are uniformly disposed on the upper portion of the deposition material 120. Particularly, when the accommodation member 130 is completely filled with the heat transfer member 150 so that there is no space in the accommodation member 130, the heat transfer member 150 may be uniformly and more efficiently disposed on the upper portion of the deposition material 120. However, it is understood that other mechanisms can be used to ensure uniformity such that the accommodation member 130 need not be completely filled with the particles.

Also, the accommodation member 130 may be formed to correspond to an inner circumferential surface of the crucible 110. Thus, the accommodation member 130 may not be shaken in the crucible 110 but may be stably disposed on the upper portion of the deposition material 120. In this case, the bottom portion 131, the side portion 132, and the top portion 133 of the accommodation member 130 are formed in the shape of a mesh plate having a mesh that is smaller than the size of particles of the heat transfer member 150 so that the heat transfer member 150 may be easily and stably accommodated in the accommodation member 130 and allows vaporized gas particles to proceed therethrough. As such, a uniform deposition process may be easily performed.

In the shown embodiment, the accommodation member 130 includes the top portion 133. The top portion 133 of the accommodation member 130 is separated from the accommodation member 130 before the heat transfer member 150 is disposed in the accommodation member 130, and after the heat transfer member 150 is disposed in the accommodation member 130, the top portion 133 may be connected to the side portion 132 of the accommodation member 130 through welding. However, it is understood that the top portion 133 could be otherwise connected. Further, in order to ensure the particles are uniformly distributed, the top portion 133 could be movable relative to a bottom portion 131 to change an internal volume of the accommodation member 130 to allow for different amounts of the heat transfer member 150, such as by using a screw to adjust the height of the top member 133.

Figure 4A:
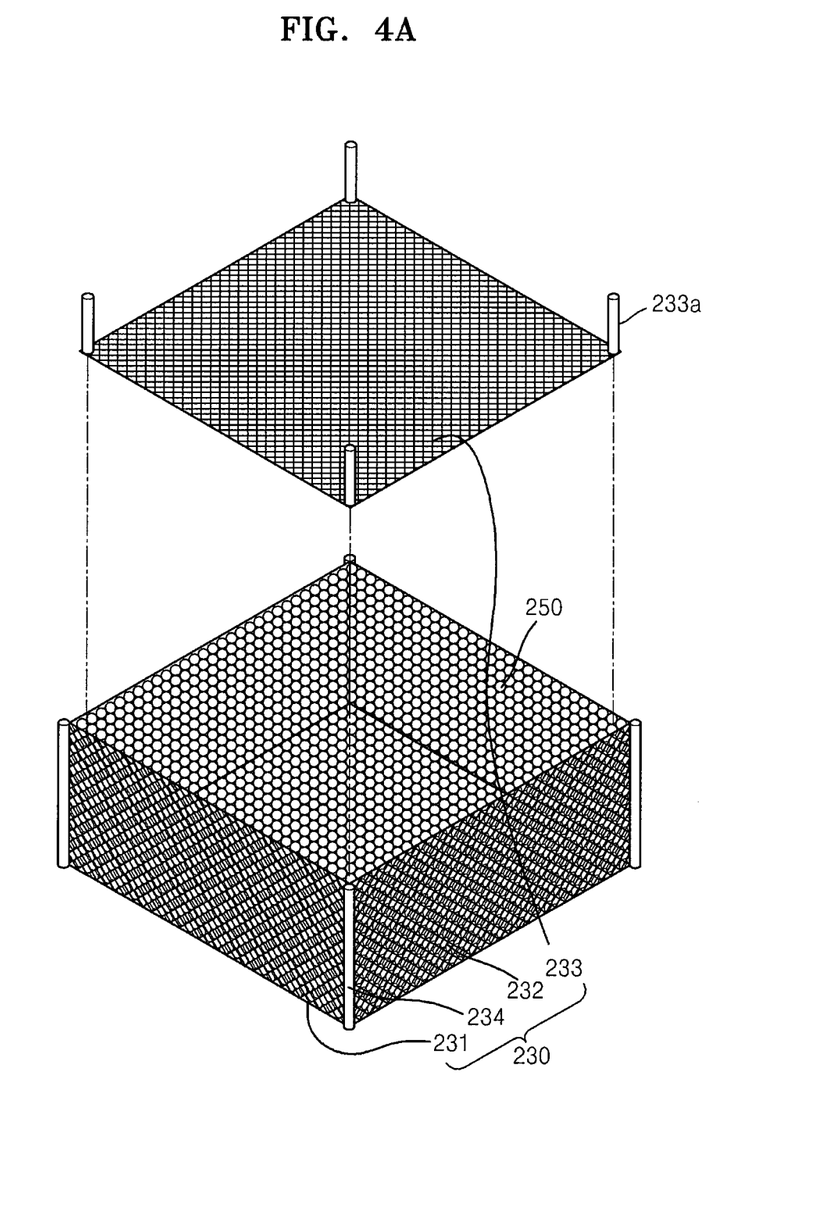
FIGS. 4A and 4B are perspective views of an accommodation member of a deposition source according to another embodiment of the present invention.
Figure 4B:
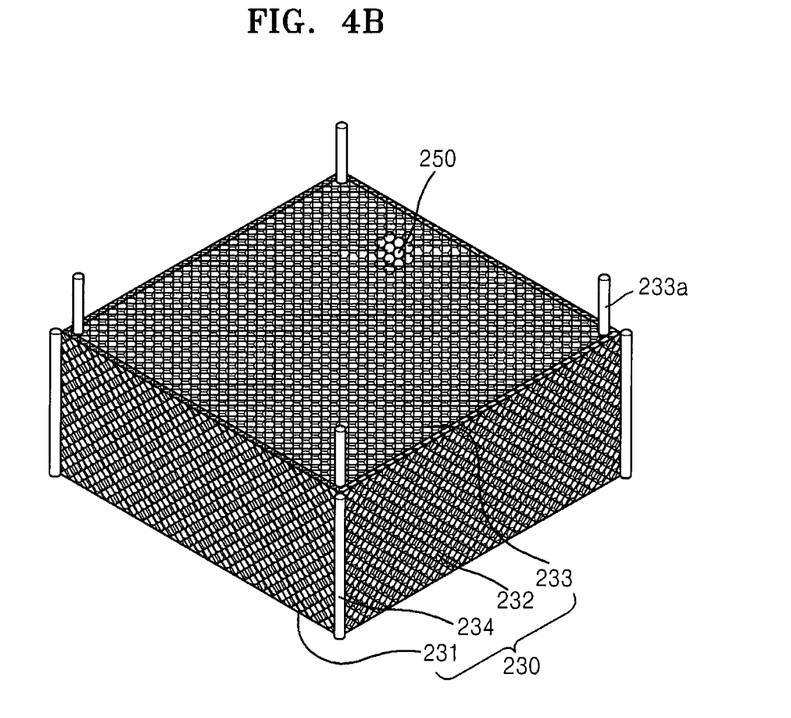

FIGS. 4A and 4B are perspective views of an accommodation member 230 of a deposition source according to another embodiment of the present invention. For convenience of explanation, only a difference between the present embodiment and the previous embodiment will now be described. Specifically, only the features of the accommodation member 230 that are different from those of the previous embodiment will now be described.

A heat transfer member 250 is disposed in the accommodation member 230. The accommodation member 230 includes a bottom portion 231, a side portion 232, and a cover portion 233. Also, supports 234 are disposed on the side portion 232. The bottom portion 231, the side portion 232, and the cover portion 233 are formed in the shape of a mesh plate. Specifically, the bottom portion 231, the side portion 232, and the top portion 233 are formed in the shape of a mesh plate having a mesh that is smaller than the size of particles of the heat transfer member 250 so that the heat transfer member 250 may not escape from the accommodation member 230.

In the shown embodiment, the accommodation member 230 includes a cover portion 233. The cover portion 233 is not bonded to the side portion 232 by welding. Referring to FIG. 4A, after the heat transfer member 250 is disposed in the accommodation member 230, the heat transfer member 250 is covered by the cover portion 233 and is fixed in the accommodation member 230, as illustrated in FIG. 4B. The cover portion 233 includes protrusions 233a that allow the cover portion 233 to be easily moved and support the cover portion 233.

The accommodation member 230 according to the present embodiment includes the cover portion 233 that is separated from the accommodation member 230, unlike the accommodation member 130 according to the previous embodiment. Thus, the heat transfer member 250 may be easily disposed in the accommodation member 230 and may be easily removed therefrom. Also, the amount of the heat transfer member 250 disposed in the accommodation member 230 may be differently adjusted according to various deposition process conditions.

Figure 5:
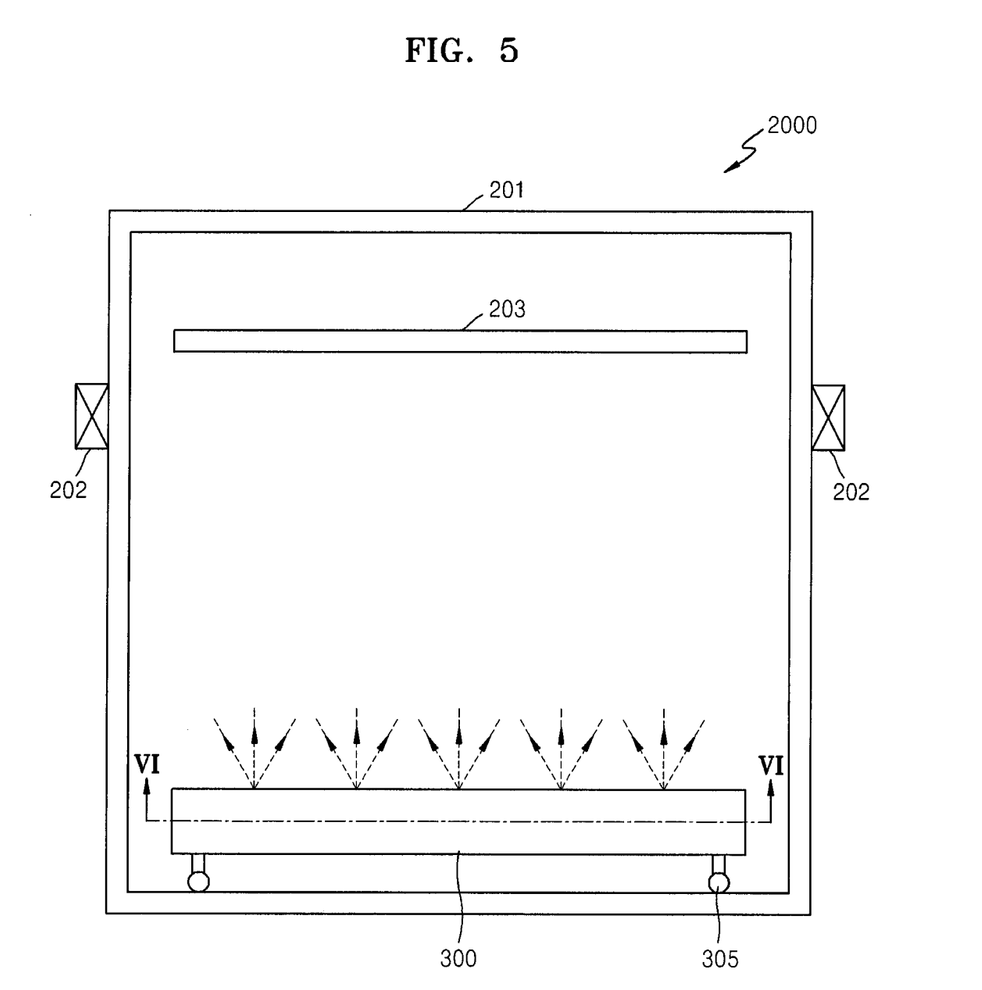
FIG. 5 is a schematic front view of a deposition device including a deposition source according to another embodiment of the present invention.
Figure 6:
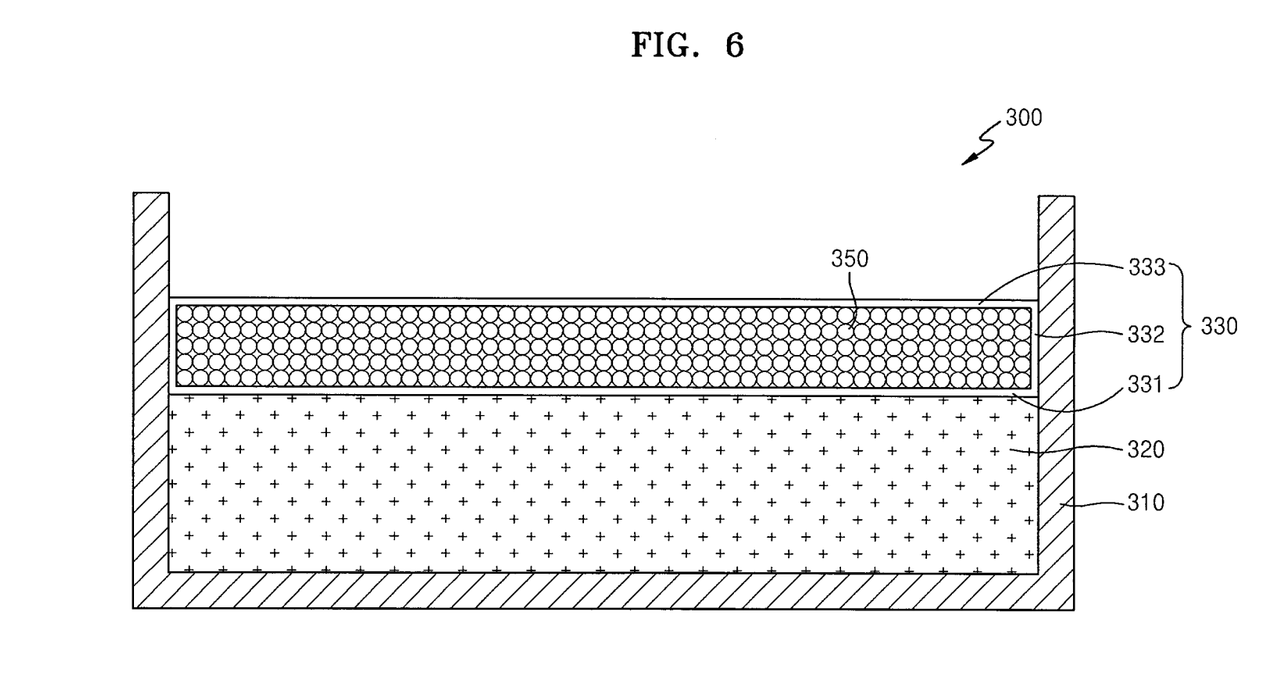
FIG. 6 is a cross-sectional view taken along line VI-VI of FIG. 5.
Figure 7:
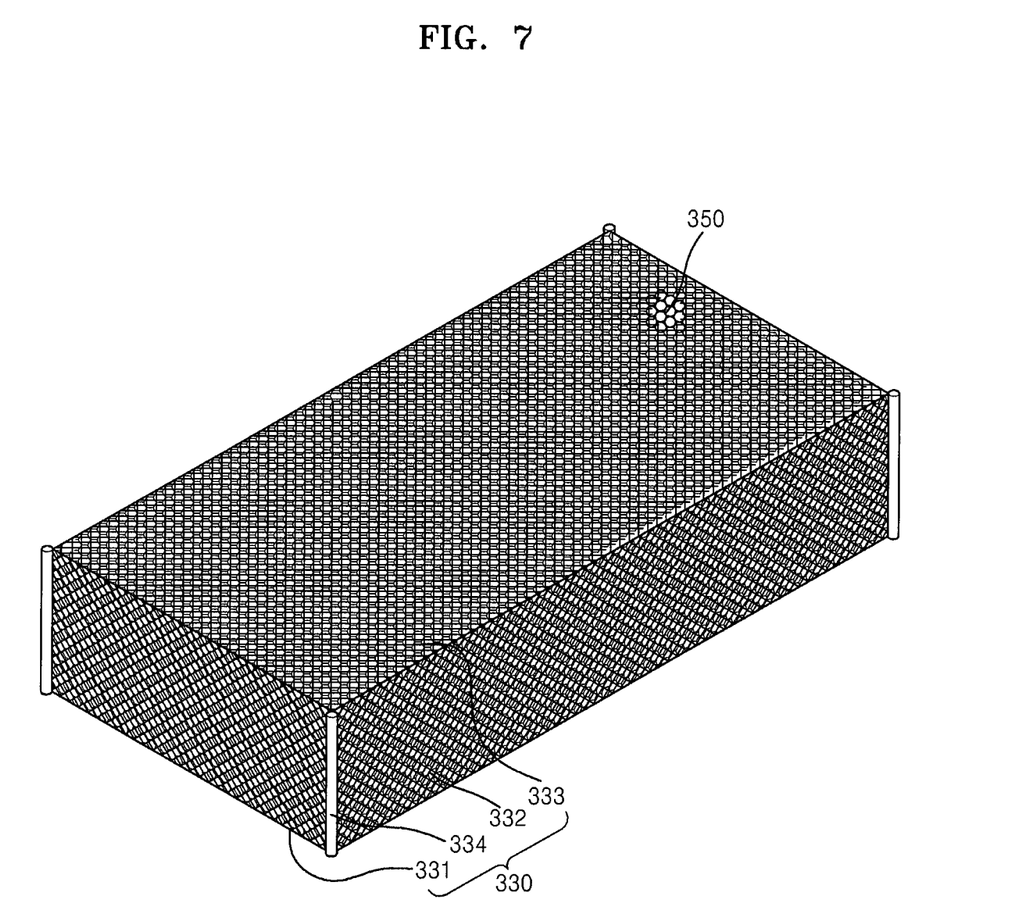
FIG. 7 is a schematic perspective view of an accommodation member of FIG. 6.

FIG. 5 is a schematic front view of a deposition device 2000 including a deposition source 300 according to another embodiment of the present invention, and FIG. 6 is a cross-sectional view taken along line VI-VI of FIG. 5, and FIG. 7 is a schematic perspective view of an accommodation member 330 of FIG. 6. For convenience of explanation, only a difference between the present embodiment and the previous embodiment of FIG. 1 will now be described.

Referring to FIG. 5, the deposition device 2000 includes a chamber 201 and the deposition source 300 disposed in the chamber 201. A substrate 203 is disposed in the chamber 201 facing the deposition source 300. Also, an outlet 202 is disposed at a side surface of the chamber 201 and is through which the substrate 203 is transferred between the outside and the inside of the chamber 201.

The deposition source 300 is of linear type in which the deposition source 300 extends from a lengthwise direction of the substrate 203. The deposition source 300 extends in one direction, and the width of the deposition source 300 in another direction is smaller than the length of the substrate 203.

Since the deposition source 300 is of linear type in which the deposition source 300 extends from the lengthwise direction of the substrate 203, the deposition source 300 may be moved so that the deposition process may be performed in the entire area of the substrate 203. A moving portion 305 that moves in one direction or multiple directions is disposed on the bottom end of the deposition source 300. The deposition source 300 is moved by the moving portion 305 in a straight direction so that the deposition process may be uniformly performed on the substrate 203. While depicted as a wheel, it is understood that the moving portion 305 is not limited thereto.

The deposition source 300 includes a rectangular crucible 310 in which a deposition material 320 is disposed, an accommodation member 330, and a heat transfer member 350. The accommodation member 330 accommodates the heat transfer member 350 and is disposed in the crucible 310. The heat transfer member 350 allows heat to be uniformly transferred to the deposition material 320 when the crucible 310 is heated, so that uniformity of deposition is improved. The heat transfer member 350 may be a thermo ball, but the invention is not limited thereto.

The accommodation member 330 includes a bottom portion 331, a side portion 332, and a top portion 333. The bottom portion 331, the side portion 332, and the top portion 333 are formed in the shape of a mesh plate. In detail, the bottom portion 331, the side portion 332, and the top portion 333 have a mesh that is smaller than the size of particles of the heat transfer member 350 so that the heat transfer member 350 may not escape from the accommodation member 330.

The accommodation member 330 further includes supports 334. The supports 334 are disposed on corner edges of the side portion 132. The supports 334 connect the bottom portion 331 and the top portion 333 so that durability of the accommodation member 330 is improved. The supports 334 may include titanium (Ti) having high durability, but the invention is not limited thereto.

The accommodation member 330 accommodates the heat transfer member 350 so that the heat transfer member 350 may be uniformly distributed over the deposition material 320. In other words, due to the accommodation member 330, the particles of the heat transfer member 350 are not concentrated in one direction but are uniformly disposed on upper portions of the deposition material 320. Particularly, when the accommodation member 330 is completely filled with the heat transfer member 350 so that there is no space in the accommodation member 330, the heat transfer member 350 may be uniformly and more efficiently disposed on the upper portions of the deposition material 320. However, it is understood that other mechanisms can be used to ensure uniformity such that the accommodation member 330 need not be completely filled with the heat transfer member 350 in all aspects of the invention.

Also, the accommodation member 330 may be formed to correspond to an inner circumferential surface of the crucible 310. Thus, the accommodation member 330 may not be shaken in the crucible 310 but may be stably disposed on the upper portions of the deposition material 320.

In the shown embodiment, the accommodation member 330 includes the top portion 333. The top portion 333 is separated from the accommodation member 330 before the heat transfer member 350 is disposed in the accommodation member 330, and after the heat transfer member 350 is disposed in the accommodation member 330, the top portion 333 may be connected to the side portion 332 by welding.

Figure 8:
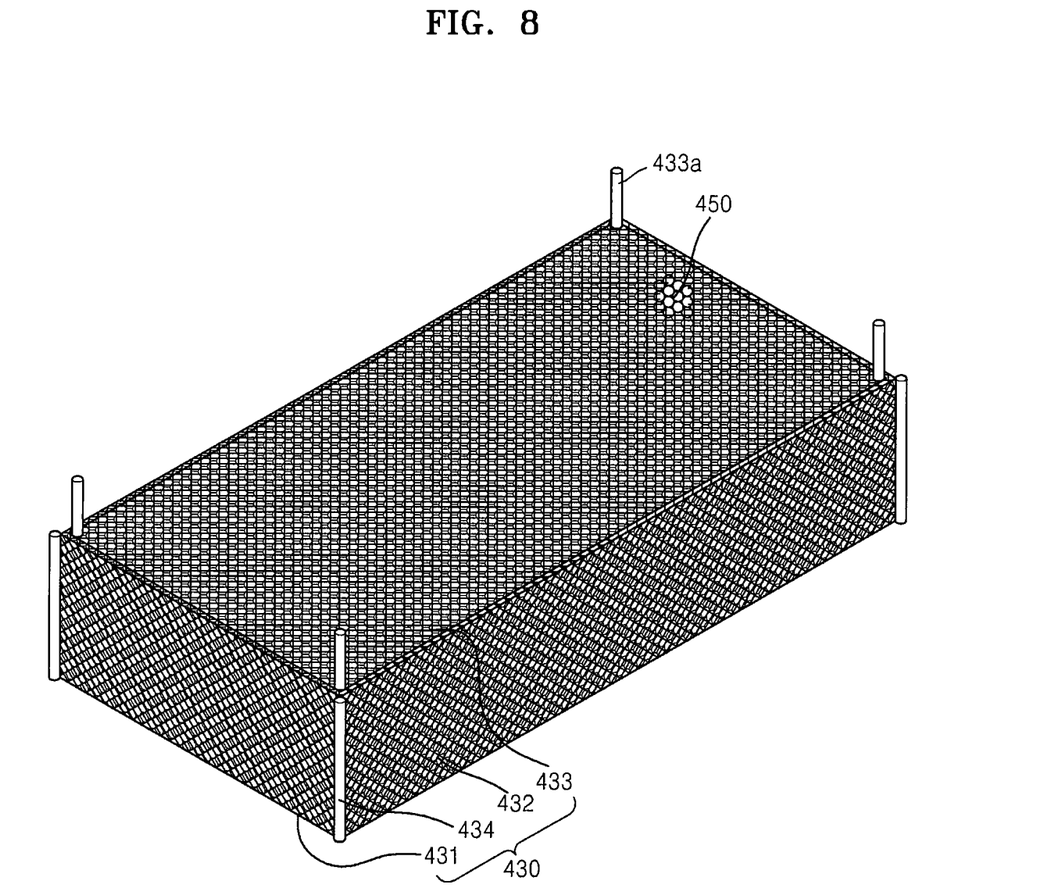
FIG. 8 is a perspective view of an accommodation member of a deposition source according to another embodiment of the present invention.

FIG. 8 is a perspective view of an accommodation member 430 of a deposition source according to another embodiment of the present invention. For convenience of explanation, only a difference between the present embodiment and the previous embodiment will now be described. Specifically, only the features of the accommodation member 430 that are different from those of the embodiment shown in FIGS. 5 through 7 will now be described.

A heat transfer member 450 is disposed in the accommodation member 430 including a bottom portion 431, a side portion 432, and a cover portion 433. Also, supports 434 are disposed on the side portion 432. The bottom portion 431, the side portion 432, and the cover portion 433 are formed in the shape of a mesh plate. Specifically, the bottom portion 431, the side portion 432, and the top portion 433 have a mesh that is smaller than the size of particles of the heat transfer member 450 so that the heat transfer member 450 may not escape from the accommodation member 430.

In the shown embodiment, the accommodation member 430 includes the cover portion 433. The cover portion 433 is not bonded to the side portion 432 by welding. Referring to FIG. 8, after the heat transfer member 450 is disposed in the accommodation member 430, the heat transfer member 450 is covered by the cover portion 433 and is fixed in the accommodation member 430. The cover portion 433 includes protrusions 433a that allow the cover portion 433 to be easily moved and support the cover portion 433.

The accommodation member 430 according to the present embodiment includes the cover portion 433 that is separated from the accommodation member 430, unlike the accommodation member 330 according to the previous embodiment of FIG. 6. Thus, the heat transfer member 450 may be easily disposed in the accommodation member 430 and may be easily removed therefrom. Also, the amount of the heat transfer member 450 disposed in the accommodation member 430 may be differently adjusted according to various deposition process conditions.

As described above, in a deposition source according to aspects of the present invention, deposition characteristics of the deposition source can be improved.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of performing deposition by using a crucible, the crucible having an opening, the method comprising:
placing a housing in the crucible between the opening of the crucible and an upper surface of a deposition material in the crucible, the housing being movable with respect to the crucible during the deposition, having a plurality of openings, and an outer perimeter of the housing having a size that corresponds to an inner circumferential surface of the crucible, the housing accommodating a heat transfer member, the heat transfer member comprising particles having a diameter greater than a size of each of the plurality of openings in the housing, the particles being non-reactive with the deposition material; and
heating the crucible and the particles such that the particles heat the upper surface of the deposition material to transform the deposition material into a gas which passes through the particles and the plurality of openings to a substrate.

2. The method of claim 1, wherein the housing comprises a bottom portion, a top portion, and a side portion extending between the top portion and the bottom portion, and
wherein the method further comprises:
placing the particles in the housing; and
closing the housing by welding the top portion to the side portion.

3. The method of claim 1, wherein the heating comprises electron beam heating or resistive heating.

4. The method of claim 1, wherein the particles comprise a silicon powder.

5. The method of claim 1, wherein the crucible is inside of a vacuum chamber.

6. The method of claim 1, wherein the outer perimeter of the housing continuously contacts the inner circumferential surface of the crucible.

* * * * *